United States Patent
Kita et al.

(10) Patent No.: US 10,324,365 B2
(45) Date of Patent: Jun. 18, 2019

(54) PROJECTOR-TYPE DISPLAY APPARATUS

(71) Applicant: SONY CORPORATION, Tokyo (JP)

(72) Inventors: Kazuhiro Kita, Tokyo (JP); Taku Inoue, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/762,364

(22) PCT Filed: Nov. 1, 2016

(86) PCT No.: PCT/JP2016/004783
§ 371 (c)(1),
(2) Date: Mar. 22, 2018

(87) PCT Pub. No.: WO2017/090234
PCT Pub. Date: Jun. 1, 2017

(65) Prior Publication Data
US 2018/0267392 A1   Sep. 20, 2018

(30) Foreign Application Priority Data
Nov. 27, 2015   (JP) .................. 2015-232325

(51) Int. Cl.
G03B 21/16 (2006.01)
H04N 9/31 (2006.01)
G03B 21/14 (2006.01)
G03B 21/00 (2006.01)
H04N 5/74 (2006.01)
H05K 5/03 (2006.01)
H05K 7/20 (2006.01)

(52) U.S. Cl.
CPC ........... *G03B 21/145* (2013.01); *G03B 21/00* (2013.01); *G03B 21/14* (2013.01); *G03B 21/16* (2013.01); *H04N 5/74* (2013.01); *H05K 5/03* (2013.01); *H05K 7/20181* (2013.01); *H04N 9/3144* (2013.01)

(58) Field of Classification Search
CPC .... G03B 21/16; G03B 21/145; H04N 9/3144; H04N 9/3141
USPC ................ 353/57, 58, 60, 61, 119
See application file for complete search history.

(56) References Cited

U.S. PATENT DOCUMENTS

| | | | |
|---|---|---|---|
| 2009/0051829 A1 | 2/2009 | Nagahata et al. | |
| 2013/0050659 A1* | 2/2013 | Awane | G03B 21/16 353/61 |

FOREIGN PATENT DOCUMENTS

| | | |
|---|---|---|
| JP | 2004-157347 A | 6/2004 |
| JP | 2008-262061 A | 10/2008 |

OTHER PUBLICATIONS

International Search Report dated Jan. 31, 2017 in PCT/JP2016/004783 filed Nov. 1, 2016.

* cited by examiner

*Primary Examiner* — Ryan D Howard
(74) *Attorney, Agent, or Firm* — Oblon, McClelland, Maier & Neustadt, L.L.P.

(57) ABSTRACT

[Object] To provide a projector-type display apparatus with ease of maintenance.
[Solving Means] According to the present technology, a projector-type display apparatus includes an optical-system-for-projecting, a housing, a fan, an air-filter, and a filter-cover. The housing includes an air-inlet-port, and houses the optical-system-for-projecting. The fan is housed in the housing, air from the air-inlet-port flowing into the fan. The air-filter is attachable to and detachable from the housing, and covers the air-inlet-port. The filter-cover is attachable to and detachable from the air-filter.

8 Claims, 14 Drawing Sheets

PROJECTOR-TYPE DISPLAY APPARATUS

TECHNICAL FIELD

The present technology relates to a projector-type display apparatus such as a liquid crystal projector and a CRT projector.

BACKGROUND ART

A projector-type display apparatus such as a liquid crystal projector and a CRT (Cathode Ray Tube) projector includes a light source, optical components, and the like. It is necessary to cool down the components heated by the light source to lower the temperature thereof. Typically, a housing of a projector-type display apparatus has an air-inlet-port. Air from the air-inlet-port flows into an air-intake fan. The intake air flows into the housing, and cools down the components.

The air-inlet-port has a filter, which blocks dust from flowing into the housing. For example, Patent Literature 1 discloses a projector-type display apparatus including a filter. The filter is attached to a housing, and is covered by a cap-for-replacing-filter. The cap has an air-inlet-port. Air flows into a housing via the air-inlet-port and the filter.

CITATION LIST

Patent Literature

Patent Literature 1: Japanese Patent Application Laid-open No. 2008-262061

DISCLOSURE OF INVENTION

Technical Problem

Where more and more dust accumulates on the filter, less and less air passes through the filter. So it is necessary to detach the filter from the housing and to replace or clean the filter on a regular basis. However, according to the structure of Patent Literature 1, it is necessary to detach the cap, which is screwed, for example, and fixed onto the housing. It is thus not easy to attach and detach the filter.

In particular, in some cases, a projector-type display apparatus is hung on a ceiling when it is used. In such a case, it is more and more difficult to attach and detach the filter. Further, when detaching the filter from the housing, due to inclination of the filter, dust may float up and flow into the air-inlet-port.

In view of the aforementioned circumstances, it is an object of the present technology to provide a projector-type display apparatus with ease of maintenance.

Solution to Problem

To attain the aforementioned object, according to an embodiment of the present technology, a projector-type display apparatus includes an optical-system-for-projecting, a housing, a fan, an air-filter, and a filter-cover.

The housing includes an air-inlet-port, and houses the optical-system-for-projecting.

The fan is housed in the housing, air from the air-inlet-port flowing into the fan.

The air-filter is attachable to and detachable from the housing, and covers the air-inlet-port.

The filter-cover is attachable to and detachable from the air-filter.

According to this structure, the filter-cover and the air-filter, which are assembled, may be attached to and detached from the housing. This structure will provide ease of maintenance compared to a structure in which a filter-cover and an air-filter are attached to a housing separately.

The air-filter and the filter-cover may be slid together to be attached to and detached from the housing.

According to this structure, even if the housing is hung on a ceiling and the air-inlet-port is positioned on a vertical-upside of the housing or the like, it is possible to attach and detach the filter-cover and the air-filter to and from the housing with ease.

The filter-cover may include a top plate part facing the air-filter, a side wall part that blocks air from flowing into a space between the top plate part and the air-filter, and an open part that allows air to flow into the space between the top plate part and the air-filter.

According to this structure, the air-inlet-port is positioned on a vertical-upside surface of the housing. Even if dust accumulates on that surface, since the top plate part covers the air-filter, it is possible to block dust from flowing into the air-filter.

The open part may be provided along a rim of a surface of the housing, the surface having the air-inlet-port, and the side wall part may be provided such that the side wall part separates the air-filter from an area of the surface, the area avoiding facing the top plate part.

According to this structure, even if dust accumulates on the surface having the air-inlet-port of the housing, air flows into the open part, which is provided on the rim of that surface, i.e., provided in a direction avoiding that surface. The side wall part may thus block dust accumulated on that surface from flowing into the air-filter.

A part of the top plate part may protrude from the rim of the surface, and the open part may be provided between the rim of the surface and the top plate part protruding from the rim of the surface.

According to this structure, the open part is spaced apart from an area of the surface having the air-inlet-port of the housing, the area avoiding facing the top plate part. So dust accumulated on that surface less flows into the open part.

The filter-cover includes a dust catcher that blocks dust from falling onto the air-inlet-port when sliding.

As described above, the filter-cover and the air-filter are slid together to be attached to and detached from the housing. So, if dust accumulated on the filter-cover falls down when sliding, the dust may flow into the air-inlet-port. However, since the dust catcher is provided, it is possible to block such dust into the air-inlet-port.

The projector-type display apparatus may be attached onto a ceiling.

The air-inlet-port may be provided on a surface of the housing, the surface being a vertical-upside of the housing where the projector-type display apparatus is attached onto a ceiling.

The air-inlet-port may be provided on a surface of the housing, the surface being a vertical-upside of the housing where the projector-type display apparatus is attached onto a ceiling.

According to this structure, where the projector-type display apparatus is attached onto a ceiling, it is possible to prevent dust from accumulating on the air-filter, which is positioned on a vertical-upside of the housing.

The air-inlet-port may be provided on a surface of the housing, the surface being a vertical-upside of the housing where the projector-type display apparatus is attached onto a wall.

According to this structure, where the projector-type display apparatus is attached onto a wall, it is possible to prevent dust from accumulating on the air-filter, which is positioned on a vertical-upside of the housing.

Advantageous Effects of Invention

As described above, according to the present technology, it is possible to provide a projector-type display apparatus with ease of maintenance. Note that the aforementioned effects are not necessarily limitations, and any other effects described in the present disclosure may be obtained.

MODE(S) FOR CARRYING OUT THE INVENTION

A projector-type display apparatus of the present embodiment will be described.

[Entire structure of projector-type display apparatus]

Figure 1:
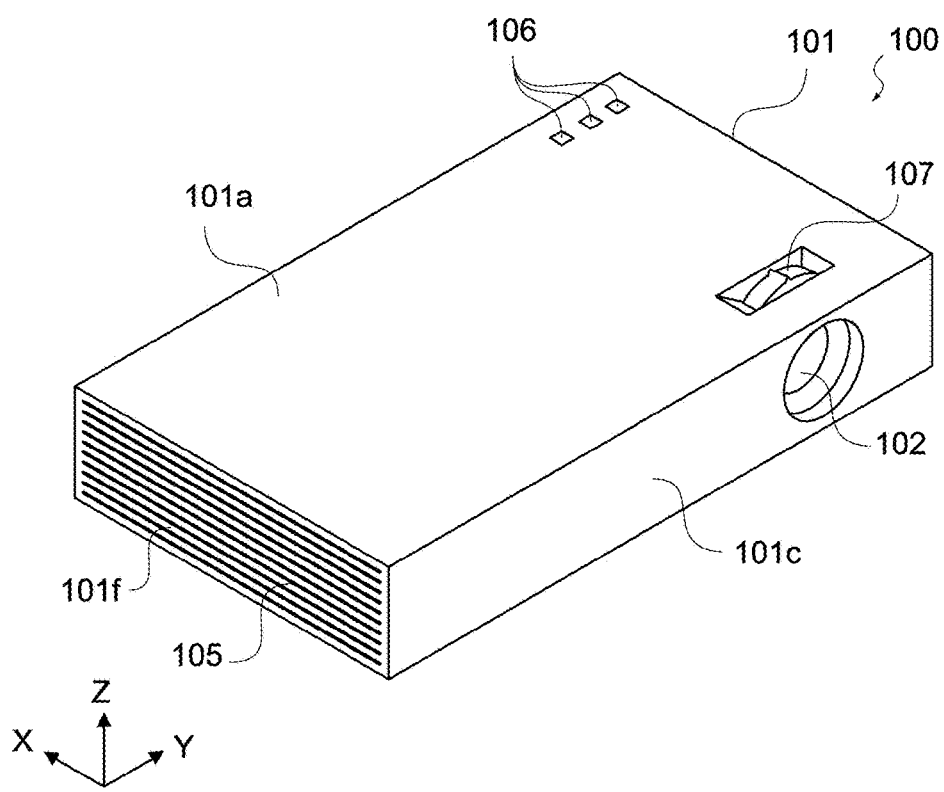
FIG. 1 A perspective view showing the projector-type display apparatus of an embodiment of the present technology.
Figure 2:
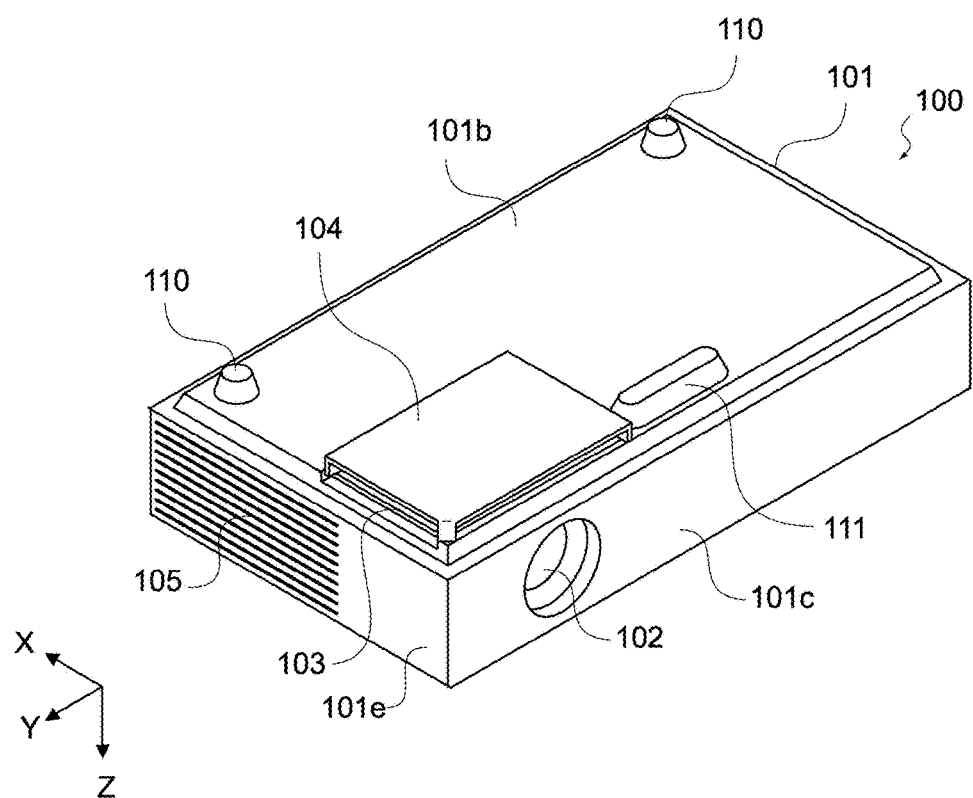
FIG. 2 A perspective view showing the projector-type display apparatus.
Figure 3:
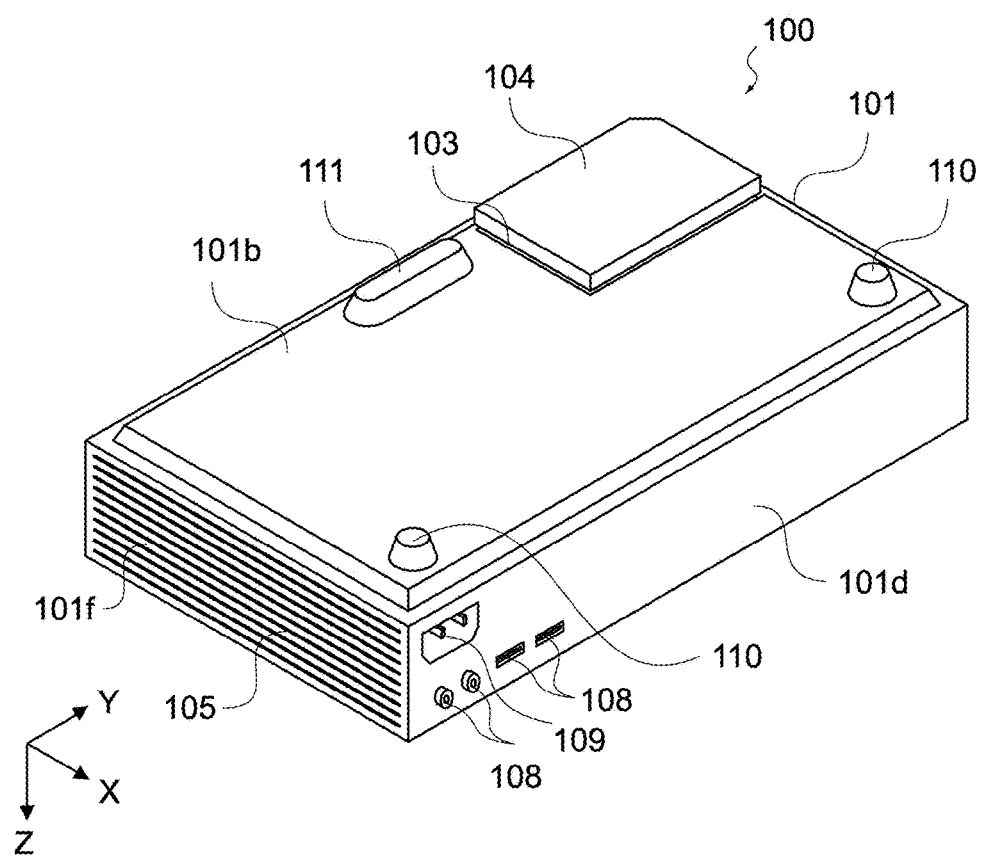
FIG. 3 A perspective view showing the projector-type display apparatus.

FIG. 1 to FIG. 3 are perspective views showing the projector-type display apparatus 100 of the present embodiment seen in different directions. In the drawings, the X direction, the Y direction, and the Z direction are three directions orthogonal to each other.

As shown in FIG. 1 to FIG. 3, the projector-type display apparatus 100 includes the housing 101, the projector lens 102, the air-filter 103, the filter-cover 104, the blowholes 105, the operational switches 106, the optical system adjustment lever 107, the image input terminals 108, the power terminal 109, the foot parts 110, and the foot part 111.

As shown in FIG. 1 to FIG. 3, the housing 101 has a substantially rectangular-parallelepiped shape, and has the top surface 101a, the bottom surface 101b, the front surface 101c the back surface 101d, the right-side surface 101e, and the left-side surface 101f. The top surface 101a is parallel to the bottom surface 101b. The front surface 101c the back surface 101d, the right-side surface 101e, and the left-side surface 101f are orthogonal to the top surface 101a and the bottom surface 101b. Further, the front surface 101c is parallel to the back surface 101d, and the right-side surface 101e is parallel to the left-side surface 101f.

The housing 101 houses an optical-system-for-projecting including a light source, an optical system, a driver circuit, the projector lens 102, and the like. A configuration of the optical-system-for-projecting is not especially limited. The optical-system-for-projecting may have any configuration as long as the optical-system-for-projecting is capable of generating an image on a basis of an image signal input in the image input terminal 108 from an external device such as a PC and projecting the image on a screen or the like from the projector lens 102.

Figure 4:
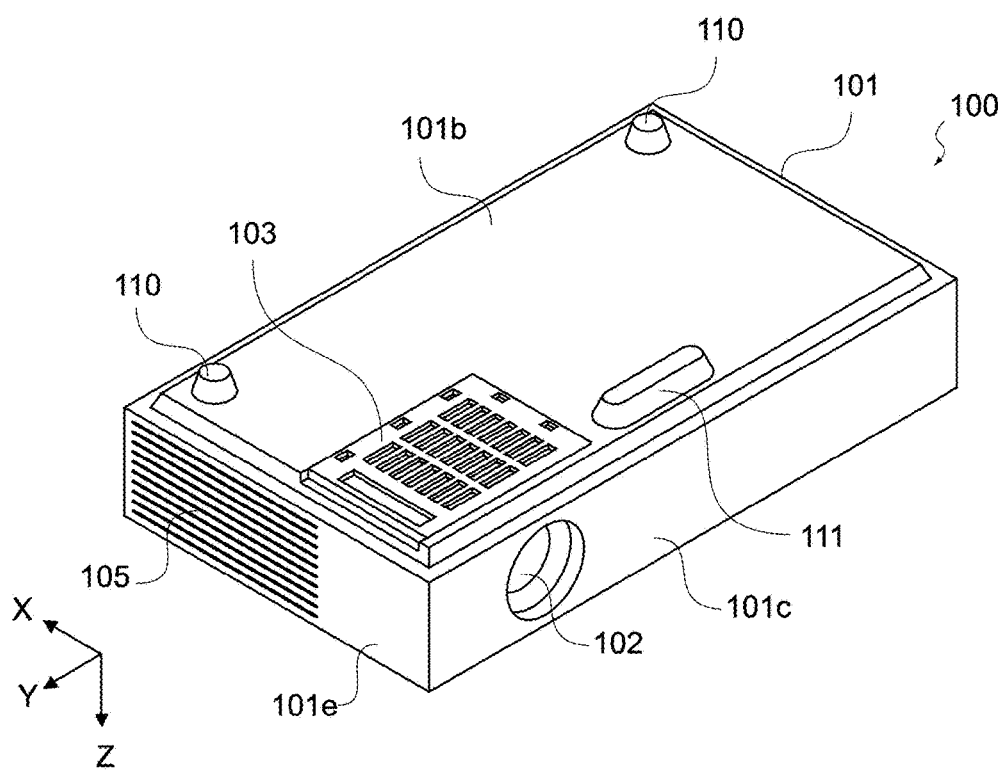
FIG. 4 A perspective view showing the projector-type display apparatus, from which the filter-cover is detached.
Figure 5:
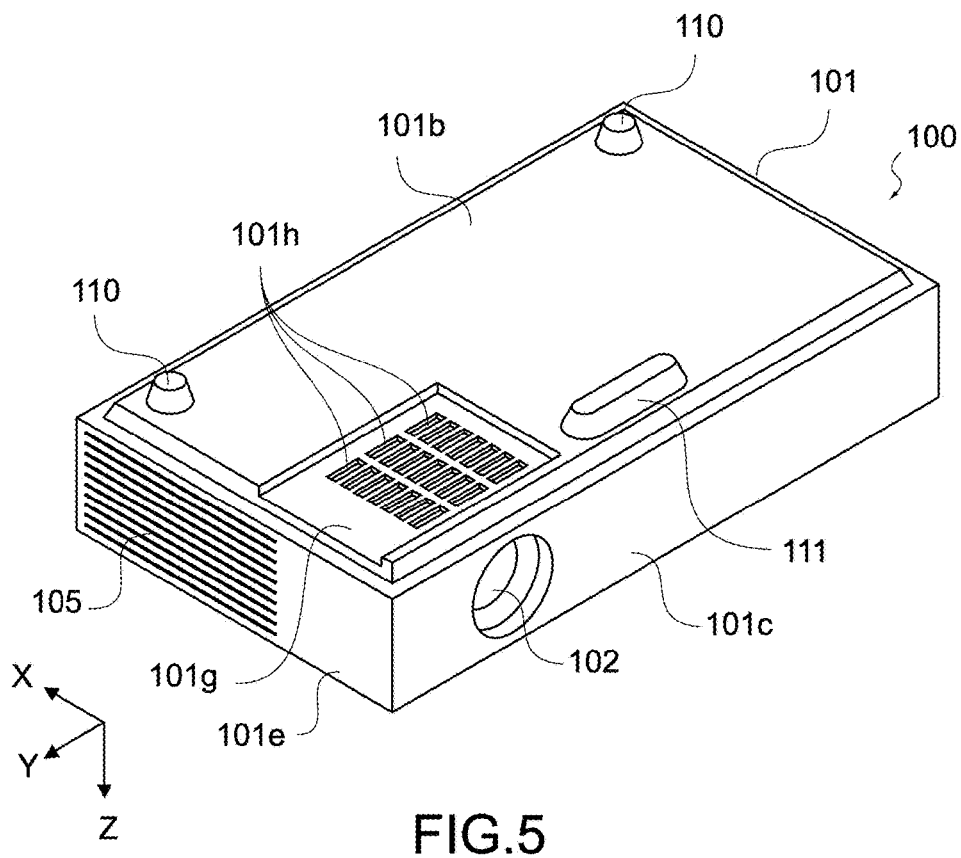
FIG. 5 A perspective view showing the projector-type display apparatus, from which the air-filter and the filter-cover are detached.

The air-filter 103 and the filter-cover 104 are attachable to and detachable from the housing 101. FIG. 4 is a perspective view showing the projector-type display apparatus 100, from which the filter-cover 104 is detached. FIG. 5 is a perspective view showing the projector-type display apparatus 100, from which the air-filter 103 and the filter-cover 104 are detached.

As shown in FIG. 5, the bottom surface 101b has the filter attachment part 101g and the air-inlet-ports 101h. The filter attachment part 101g is concave from the bottom surface 101b. As shown in FIG. 4, the filter attachment part 101g has a depth such that the air-filter 103 is flush with the bottom surface 101b where the air-filter 103 is attached to the housing 101.

The air-inlet-ports 101h are formed in the filter attachment part 101g, and are openings for communication between the inside and the outside of the housing 101, the number and the shape thereof being not especially limited.

The housing 101 has an air-intake fan (not shown) inside. The air-intake path thereof is connected to the air-inlet-ports 101h. As shown in FIG. 5, the filter attachment part 101g and the air-inlet-ports 101h of the housing 101 may be near the projector lens 102. Not limited to that, the filter attachment part 101g and the air-inlet-ports 101h may be on any positions as long as it is effective to cool down the optical-system-for-projecting.

The front surface 101c has the projector lens 102. As described above, the projector lens 102 is a part of the optical-system-for-projecting, and projects an image on a screen or the like.

The air-filter 103 is a filter that removes dust from the air flowing into the air-inlet-ports 101h. The filter-cover 104 is a cover that blocks dust flowing into the air-filter 103. The air-filter 103 and the filter-cover 104 will be described later.

The right-side surface 101e and the left-side surface 101f have the blowholes 105. The blowholes 105 include openings for communication between the inside and the outside of the housing 101. Air flowing into the housing 101 from the air-inlet-ports 101h goes out from the blowholes 105. The positions and shapes of the blowholes 105 are not especially limited.

The top surface 101a has the operational switches 106. The operational switches 106 are switches for operations of the projector-type display apparatus 100, and include a power switch, a switch for selecting a device that inputs an image, and the like. The top surface 101a has the optical system adjustment lever 107. The optical system adjustment lever 107 is a lever for adjusting the focus of the projector lens 102 and the like.

The back surface 101d has the power terminal 109. The power terminal 109 is a terminal to which a power cord is connected. The back surface 101d has the image input terminals 108. Each of the image input terminals 108 is a terminal to which a device that outputs an image such as a PC is connected.

The bottom surface 101b has the foot parts 110 near the back surface 101d side. The bottom surface 101b has the foot part 111 near the front surface 101c side. The foot parts 110 and the foot part 111 support the housing 101 on a table, on which the projector-type display apparatus 100 is placed. The height of the foot part 111 from the bottom surface 101b may be adjustable.

[Air-filter and Filter-cover]

Figure 6:
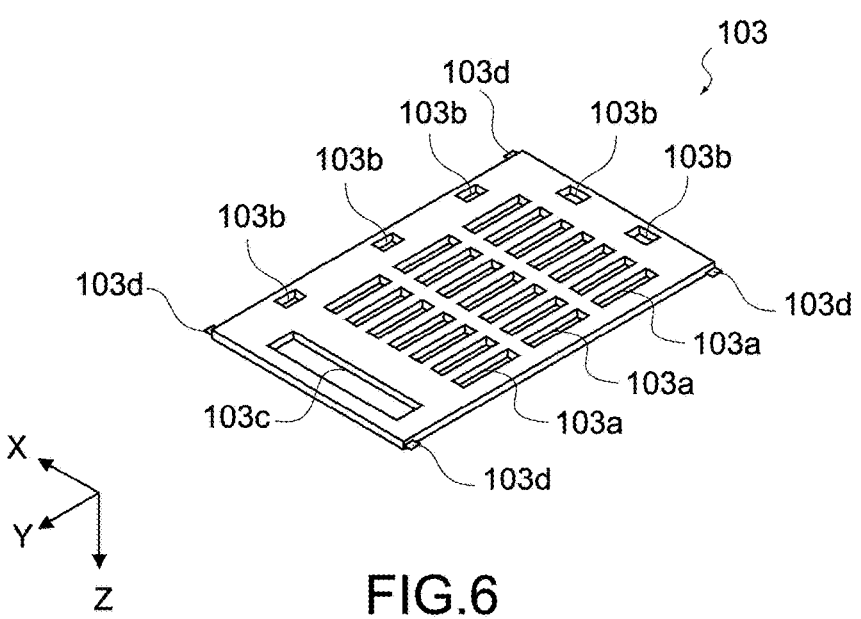
FIG. 6 A perspective view showing the air-filter of the projector-type display apparatus.

FIG. 6 is a perspective view showing the air-filter 103. As shown in FIG. 6, the air-filter 103 has a plate shape, and has the openings 103a, the holes-connected-with-cover 103b, the grip 103c, and the tabs-engaged-with-housing 103d.

The openings 103a are openings for communication between the front surface and the back surface of the air-filter 103. At least one of the inside of the openings 103a, the front surface of the air-filter 103, and the back surface of the air-filter 103 has a filter material having fine pores. The filter material catches dust in the air passing through the openings 103a. As shown in FIG. 4, where the air-filter 103 is attached to the housing 101, the openings 103a are placed immediately above the air-inlet-ports 101h of the housing 101.

The holes-connected-with-cover 103b are holes that are used to attach the filter-cover 104 to the air-filter 103. A user uses the grip 103c to slide the air-filter 103 on the housing 101.

Figure 7:
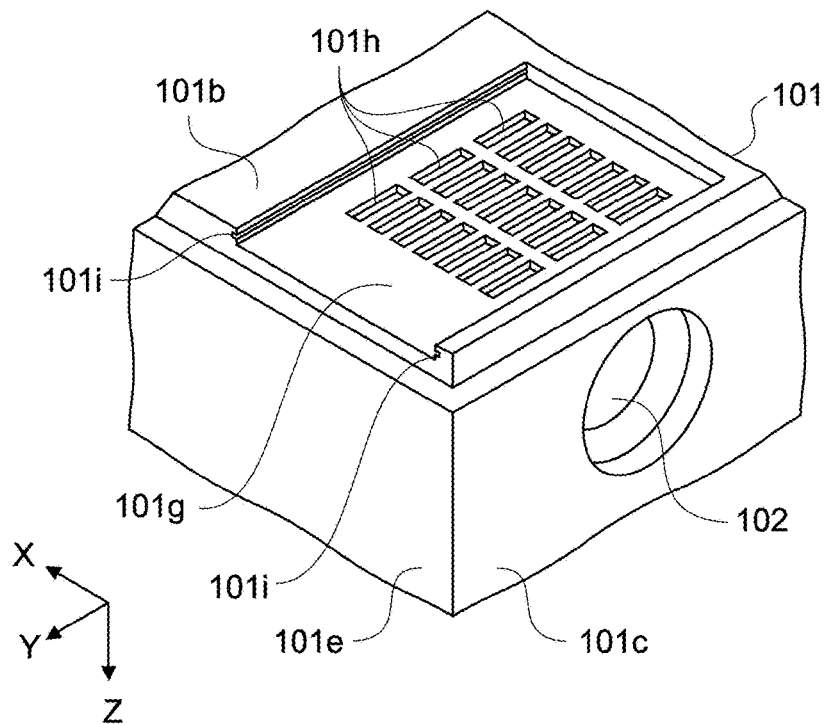
FIG. 7 A perspective view showing the air-inlet-port of the housing of the projector-type display apparatus.

The tabs-engaged-with-housing 103d are protrusions provided on side surfaces of the air-filter 103. The air-filter 103 is capable of sliding on the housing 101 with the use of the tabs-engaged-with-housing 103d. FIG. 7 is a perspective view showing the filter attachment part 101g of the housing 101 and therearound. As shown in FIG. 7, the filter attachment part 101g has the guide grooves 101i. The tabs-engaged-with-housing 103d are inserted in the guide grooves 101i, and guide the air-filter 103 sliding on the housing.

The sliding direction of the air-filter 103 on the housing 101 may be a direction parallel to the bottom surface 101b. Note that the structure, which allows the air-filter 103 to slide on the housing, is not limited to the aforementioned structure. For example, the air-filter 103 may have guide grooves, and the housing 101 may have tabs engaged with the air-filter. Further, according to another possible structure, the air-filter 103 comes in close contact with the filter attachment part 101g in the direction orthogonal to the bottom surface 101b, is then slid slightly, and is thereby attached to the housing 101.

Figure 8:
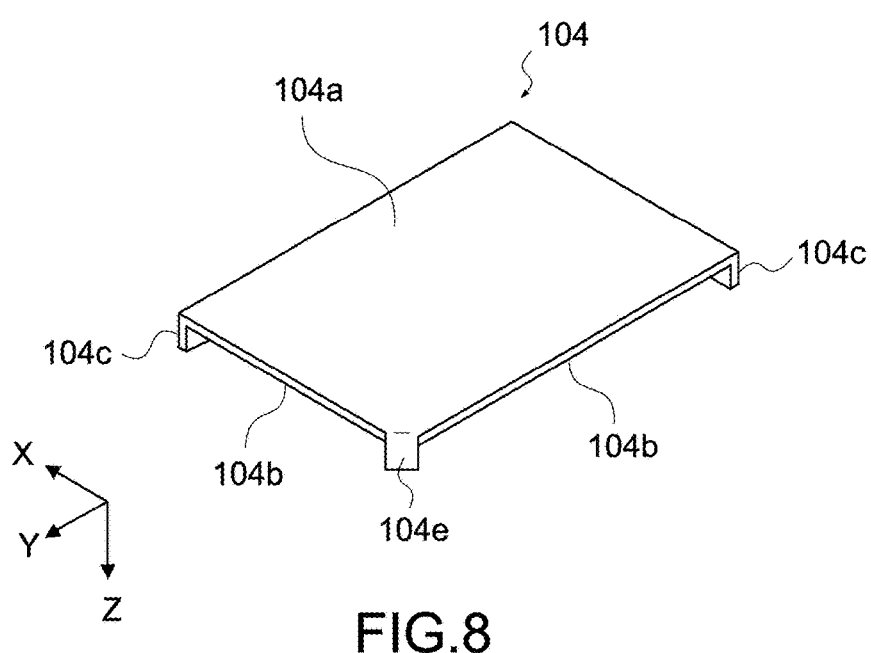
FIG. 8 A perspective view showing the filter-cover of the projector-type display apparatus.
Figure 9:
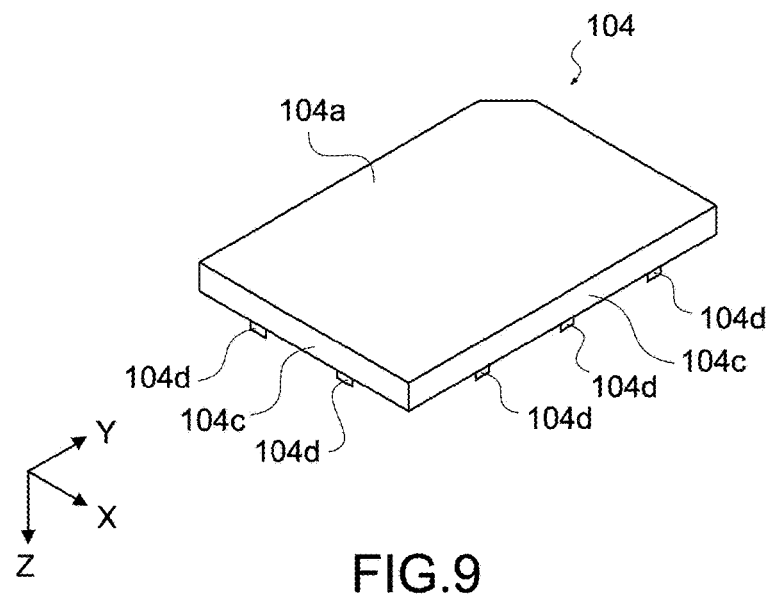
FIG. 9 A perspective view showing the filter-cover of the projector-type display apparatus.
Figure 10:
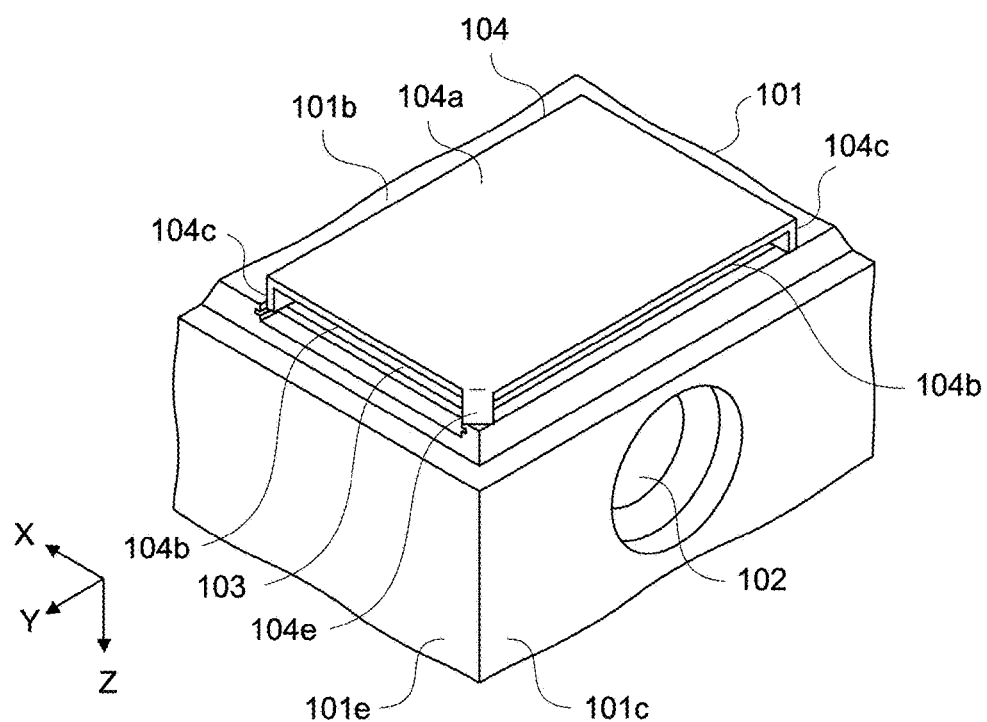
FIG. 10 A perspective view showing the filter-cover and the air-filter of the projector-type display apparatus.
Figure 11:
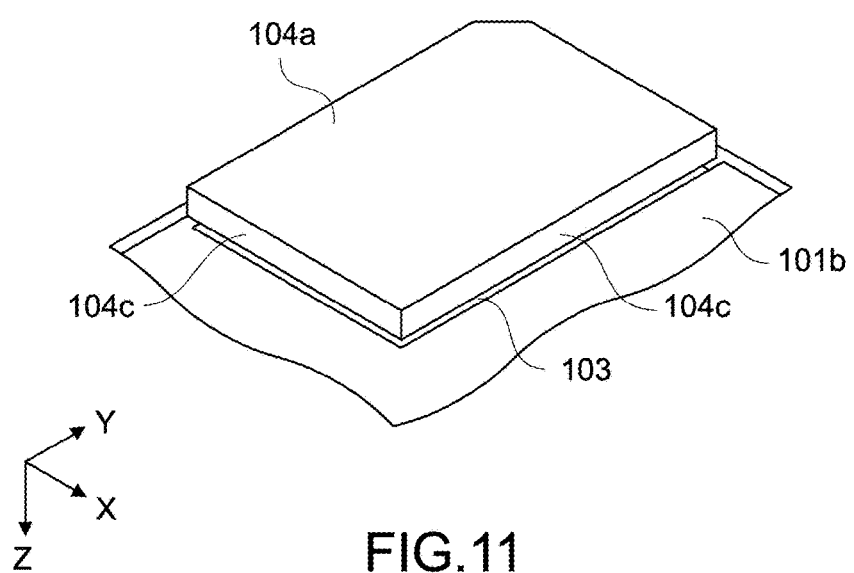
FIG. 11 A perspective view showing the filter-cover and the air-filter of the projector-type display apparatus.

FIG. 8 and FIG. 9 are perspective views showing the filter-cover 104 seen in different directions. FIG. 10 and FIG. 11 are perspective views showing the filter-cover 104 attached to the housing 101 seen in different directions. As shown in FIG. 8 to FIG. 11, the filter-cover 104 includes the top plate part 104a, the open parts 104b, the side wall parts 104c, the tabs-engaged-with-filter 104d, and the support part 104e.

The top plate part 104a is a plate-shaped part. Where the filter-cover 104 is attached to the housing 101, the top plate part 104a faces the air-filter 103, the top plate part 104a being spaced apart from the air-filter 103. The height of the top plate part 104a from the bottom surface 101b is not especially limited. Preferably, the height is such that, where the projector-type display apparatus 100 is placed on a table and the foot parts 110 and the foot part 111 come in close contact with the table, the top plate part 104a does not contact with the table.

As shown in FIG. 10, the open parts 104b are gaps between the top plate part 104a and the housing 101. The open parts 104b allow air to flow into the space between the top plate part 104a and the air-filter 103. The side wall parts 104c are plate-shaped parts that are orthogonal to the bottom surface 101b where the filter-cover 104 is attached to the housing 101.

The tabs-engaged-with-filter 104d are on the edges of the side wall parts 104c. Where the tabs-engaged-with-filter 104d are inserted in the holes-connected-with-cover 103b of the air-filter 103, the filter-cover 104 is fixed onto the air-filter 103. As shown in FIG. 11, the side wall parts 104c thereby close the space between the top plate part 104a and the air-filter 103. The side wall parts 104c block air from flowing into the space between the top plate part 104a and the air-filter 103.

Figure 12:
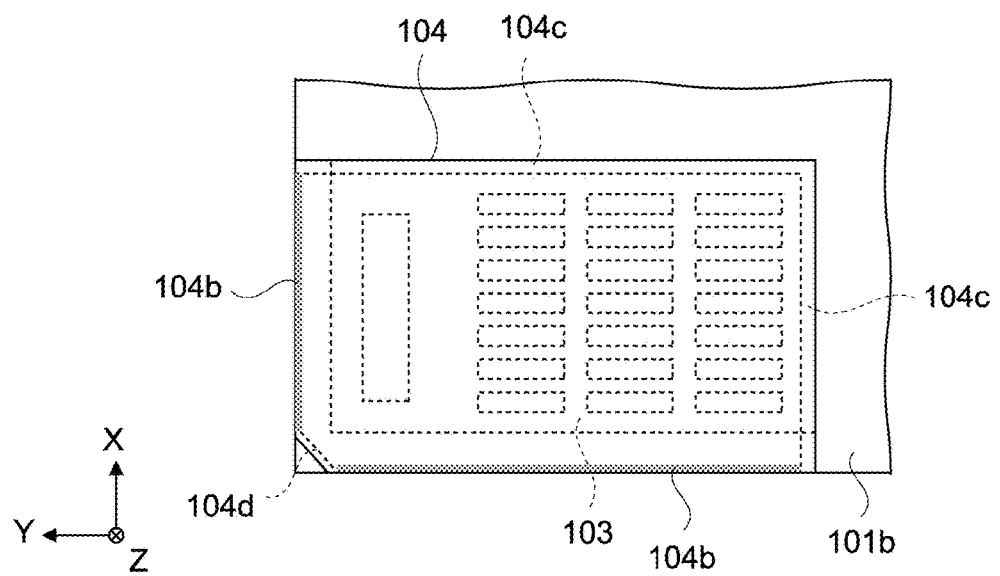
FIG. 12 A plan view showing the air-filter of the projector-type display apparatus.

FIG. 12 is a plan view showing the filter-cover 104 seen in a direction orthogonal to the bottom surface 101b. As shown in FIG. 12, the open parts 104b are provided along rims of the bottom surface 101b. According to the present embodiment, where the filter-cover 104 is seen in the direction orthogonal to the bottom surface 101b, two edges of the substantially-rectangular top plate part 104a overlap with rims of the bottom surface 101b. It means that the open parts 104b are formed between those two edges and the housing 101.

If one edge of the top plate part 104a overlaps with a rim of the bottom surface 101b where the filter-cover 104 is seen in the direction orthogonal to the bottom surface 101b, the open part 104b may be formed between that edge and the housing 101. Similarly, if three edges of the top plate part 104a overlap with rims of the bottom surface 101b where the filter-cover 104 is seen in the direction orthogonal to the bottom surface 101b, the open parts 104b may be formed between those three edges and the housing 101.

The side wall parts 104c are provided such that the side wall parts 104c separate the air-filter 103 from an area of the bottom surface 101b, the area avoiding facing the top plate part 104a. The area of the bottom surface 101b, the area avoiding facing the top plate part 104a, is an area around the filter-cover 104, where the filter-cover 104 is seen in the direction orthogonal to the bottom surface 101b.

The support part 104e is provided on a rim of the top plate part 104a, is at a position spaced apart from the side wall parts 104c, and protrudes from the top plate part 104a in the direction toward the housing 101. Where the filter-cover 104 is attached to the housing 101, the support part 104e comes in close contact with the housing 101 and supports the top plate part 104a. Note that, if the top plate part 104a has a certain size or is made of a certain material and the top plate part 104a thereby has enough strength, the support part 104e may not be provided.

Figure 13:
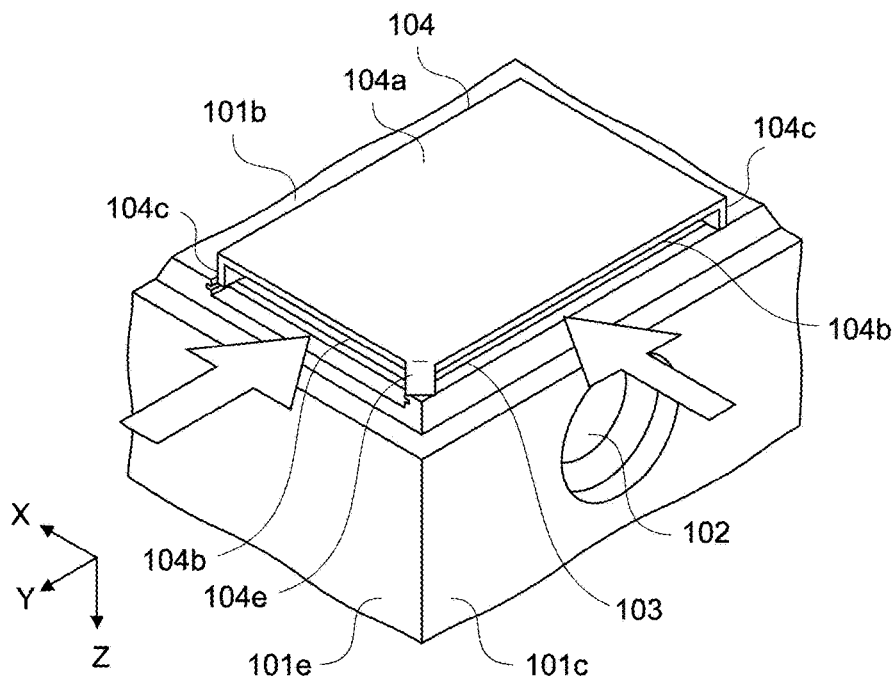
FIG. 13 A diagram schematically showing directions of airflow flowing into the air-filter of the projector-type display apparatus.

FIG. 13 is a diagram schematically showing the filter-cover 104 and directions of airflow. Upon powering on the projector-type display apparatus 100 where the air-filter 103 and the filter-cover 104 are attached to the housing 101, the air-intake fan housed in the housing 101 is driven, and air flows into the air-inlet-ports 101h.

Note that the filter-cover 104 has the open parts 104b. As the arrows shown in FIG. 13, air therefore flows into the filter-cover 104 from the open parts 104b, and flows into the air-inlet-ports 101h via the air-filter 103. The side wall parts 104c are provided between the air-filter 103 and the area of the bottom surface 101b, the area avoiding facing the top plate part 104a. So airflow from that area is blocked.

The projector-type display apparatus 100 may be placed where the bottom surface 101b is a vertical-downside, when it is used. In addition, the projector-type display apparatus 100 may be hung on a ceiling where the bottom surface 101b is a vertical-upside, when it is used. Note that, where the bottom surface 101b is the vertical-upside, dust accumulates on the bottom surface 101b.

In the filter-cover 104, the side wall parts 104c are provided between the outer sides of the filter-cover 104 and the bottom surface 101b. The open parts 104b are provided along rims of the bottom surface 101b. Dust accumulated on the bottom surface 101b is thus blocked from flowing into the filter-cover 104. So, even if the projector-type display apparatus 100 is placed where the bottom surface 101b is a vertical-upside, the maintenance frequency of the air-filter 103 is not affected.

[Attachment and Detachment of Air-filter and Filter-cover]

Figure 14:
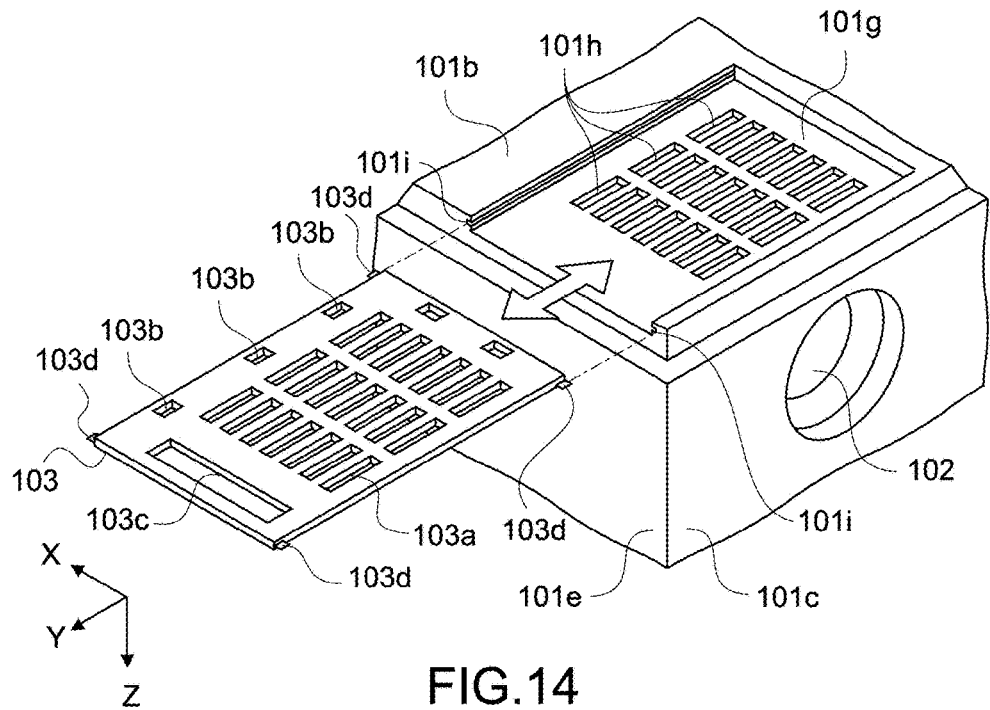
FIG. 14 A diagram schematically showing how to attach and detach the air-filter of the projector-type display apparatus to and from the housing.

FIG. 14 is a diagram schematically showing how to attach and detach the air-filter 103. As shown in FIG. 14, the air-filter 103 may be attached to the housing 101 by inserting the tabs-engaged-with-housing 103d in the guide grooves 101i and sliding the air-filter 103 on the housing 101.

The sliding direction may be a direction parallel to the bottom surface 101b. Note that, according to the structure of the present embodiment, the air-filter 103 is slid on the housing 101 from the right-side surface 101e side. According to an alternative structure, the air-filter 103 may be slid on the housing 101 from the front surface 101c side.

Figure 15:
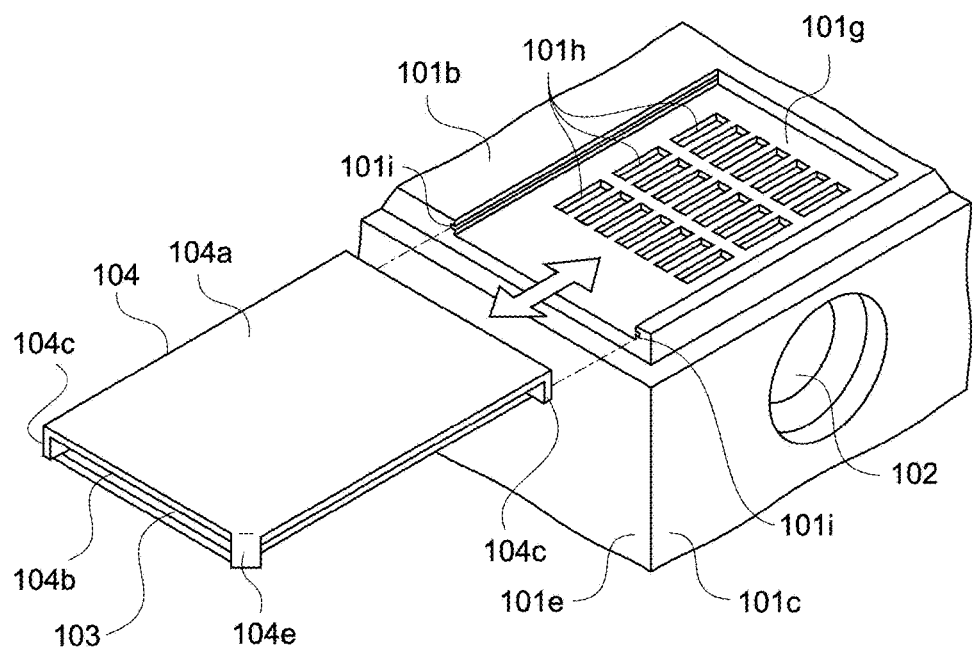
FIG. 15 A diagram schematically showing how to attach and detach the filter-cover and the air-filter of the projector-type display apparatus to and from the housing.

The filter-cover 104 may be attached to the air-filter 103 by inserting the tabs-engaged-with-filter 104d in the holes-connected-with-cover 103b. FIG. 15 is a diagram schematically showing how to attach and detach the filter-cover 104. As shown in FIG. 15, the air-filter 103 and the filter-cover 104 are slid together to be attached to and detached from the housing 101, where the filter-cover 104 is attached to the air-filter 103.

So, even if the projector-type display apparatus 100 is hung on a ceiling and the bottom surface 101b faces the vertical-upside, it is possible to slide the air-filter 103 and the filter-cover 104 together to be attached and detached. Meanwhile, according to a structure of a typical projector-type display apparatus, it is necessary to detach a filter-cover and then detach an air-filter. If the projector-type display apparatus is hung on a ceiling, in many cases, it is difficult to see the filter-cover and the air-filter and, in addition, it is difficult to attach and detach the filter-cover and the air-filter because a space between the ceiling and the projector-type display apparatus is narrow.

To the contrary, according to the structure of the present embodiment, it is possible to attach and detach the air-filter 103 and the filter-cover 104 to and from the housing 101 only by sliding the air-filter 103 and the filter-cover 104 together between a ceiling and the projector-type display apparatus, which will provide ease of maintenance. Further, as described above, dust is blocked from flowing into the air-filter 103 by the top plate part 104a of the filter-cover 104 covering the air-filter 103 and thanks to the arrangement of the open parts 104b and the side wall parts 104c. So, even if the bottom surface 101b is a vertical-upside, the maintenance frequency is not affected.

Note that the filter-cover 104 may be attached to the air-filter 103 after the air-filter 103 is solely attached to the housing 101.

[Dust Catcher]

As described above, the filter-cover 104 and the air-filter 103 are slid together to be attached to and detached from the housing 101. Note that, where the bottom surface 101b is a vertical-upside, dust accumulates on the bottom surface 101b and the top plate part 104a. In view of that, the filter-cover 104 may have a dust catcher.

Figure 16:
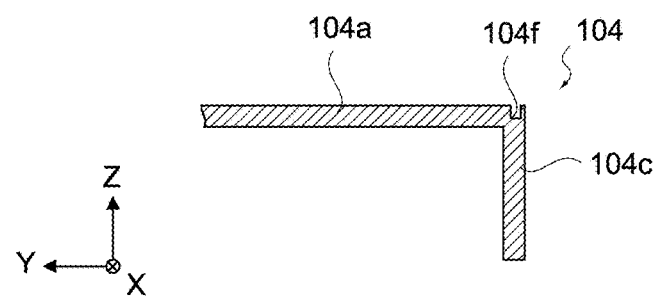
FIG. 16 A cross-sectional view showing the filter-cover of the projector-type display apparatus.
Figure 17:
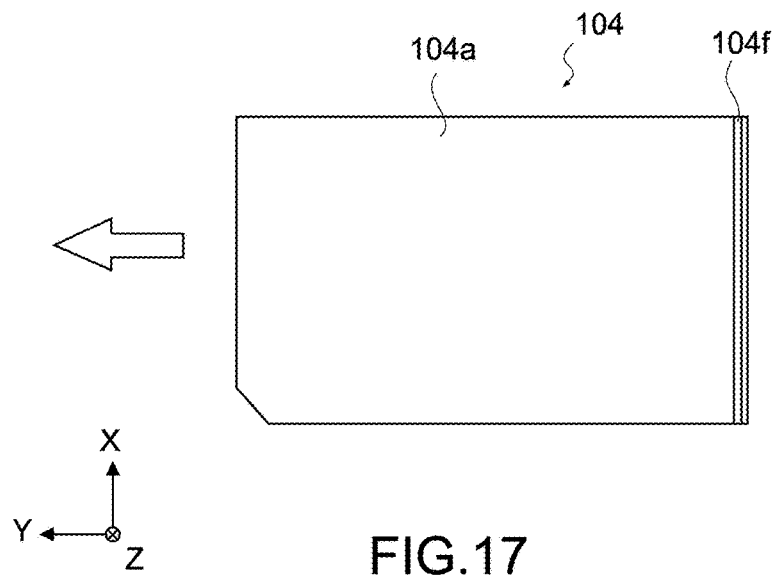
FIG. 17 A plan view showing the filter-cover of the projector-type display apparatus.

FIG. 16 is a cross-sectional view showing a part of the filter-cover 104. FIG. 17 is a plan view showing the filter-cover 104. As shown in FIG. 16 and FIG. 17, the filter-cover 104 may have the dust catcher 104f.

The dust catcher 104f is on a front surface (surface opposite to surface facing air-filter 103) of the top plate part 104a, and has a groove-shaped structure. As shown in FIG. 17, the dust catcher 104f extends in a direction orthogonal to the sliding direction (arrow of FIG. 17) of the filter-cover 104. Preferably, the dust catcher 104f may be positioned near a rim of the top plate part 104a, the rim being the back end of the top plate part 104a when sliding the filter-cover 104 to be detached from the housing 101.

If the dust catcher 104f is not provided, when the filter-cover 104 is slid on the housing 101, dust accumulated on the top plate part 104a may float up, and the dust may fall down from the top plate part 104a over the rim of the top plate part 104a. The dust falls toward the air-inlet-ports 101h (see FIG. 15), and the dust may thus flow into the air-inlet-ports 101h. The dust catcher 104f may catch dust floating up from the top plate part 104a, and block the dust from falling down from the rim of the top plate part 104a.

Figure 18:
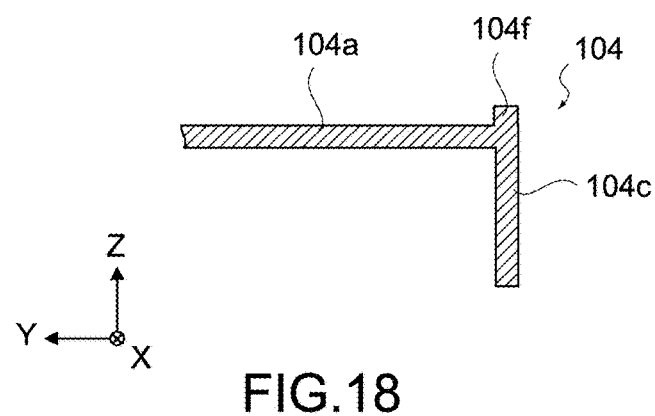
FIG. 18 A cross-sectional view showing a filter-cover of the projector-type display apparatus.
Figure 19:
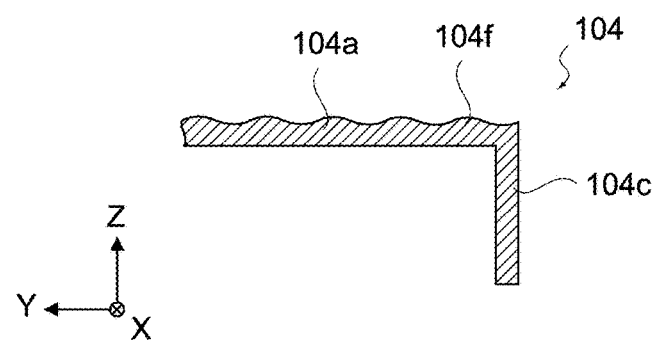
FIG. 19 A cross-sectional view showing a filter-cover of the projector-type display apparatus.
Figure 20:
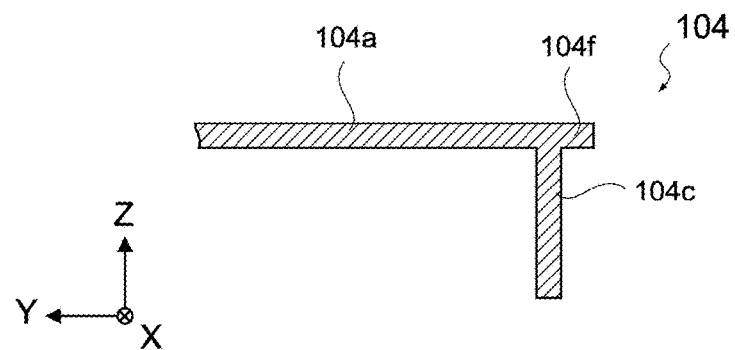
FIG. 20 A cross-sectional view showing a filter-cover of the projector-type display apparatus.

The dust catcher 104f may have not only the aforementioned groove but also another structure capable of blocking dust from falling down when sliding. FIG. 18 to FIG. 20 are cross-sectional views showing the dust catchers 104f having various structures. As shown in FIG. 18, the dust catcher 104f may be a convex part provided on a rim of the top plate part 104a and extending in a direction orthogonal to the sliding direction.

Further, as shown in FIG. 19, the dust catcher 104*f* may be a concavo-convex waveform formed on the top plate part 104*a*. As shown in FIG. 20, the dust catcher 104*f* may be a protrusion of the top plate part 104*a* from the side wall parts 104*c*.

Figure 21:
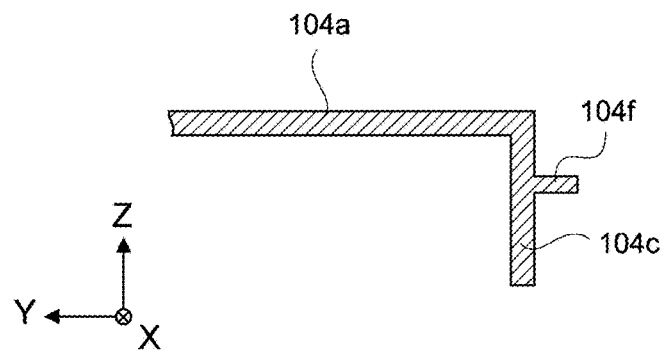
FIG. 21 A cross-sectional view showing a filter-cover of the projector-type display apparatus.
Figure 22:
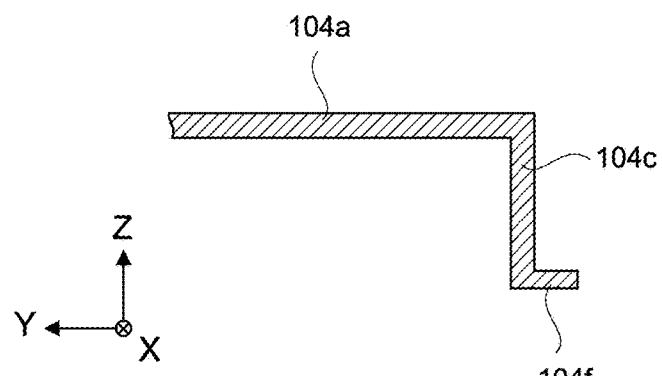
FIG. 22 A cross-sectional view showing a filter-cover of the projector-type display apparatus.

Further, the dust catcher 104*f* may be formed on the side wall parts 104*c*. Each of FIG. 21 and FIG. 22 is a cross-sectional view showing the dust catcher 104*f* formed on the side wall part 104*c*. As shown in each of FIG. 21 and FIG. 22, the dust catcher 104*f* may be a protruding part formed on the side wall part 104*c* and extending in a direction orthogonal to the sliding direction. A groove, a convex part, or the like may be formed on the protruding part.

[Modification Examples]

Figure 23:
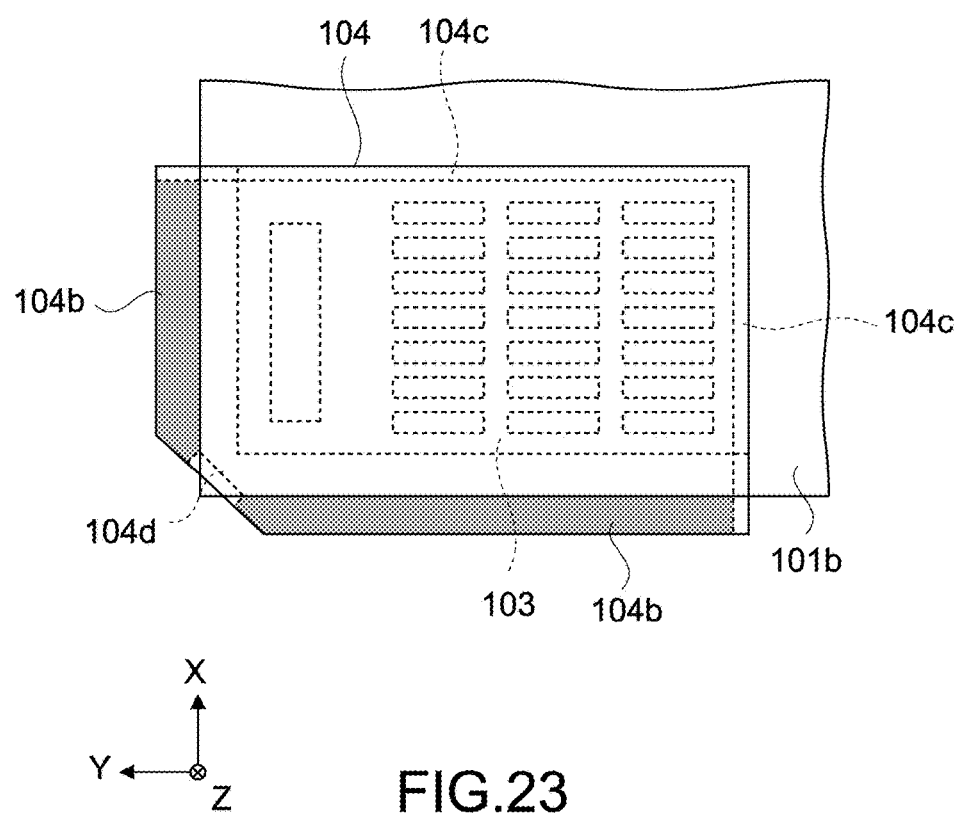
FIG. 23 A plan view showing the filter-cover of the projector-type display apparatus according to a modification example of the present technology.

FIG. 23 is a plan view showing the filter-cover 104 of the projector-type display apparatus 100 according to a modification example, which is seen in a direction orthogonal to the bottom surface 101*b*. As shown in FIG. 23, parts of the top plate part 104*a* may protrude from rims of the bottom surface 101*b*. The open parts 104*b* may be provided between the rims of the bottom surface 101*b* and the top plate part 104*a* protruding from the rims of the bottom surface 101*b*. The open parts 104*b* are therefore spaced apart from outer sides of the bottom surface 101*b* of the filter-cover 104. So dust accumulated on the bottom surface 101*b* less flows into the open parts 104*b*.

Figure 24:
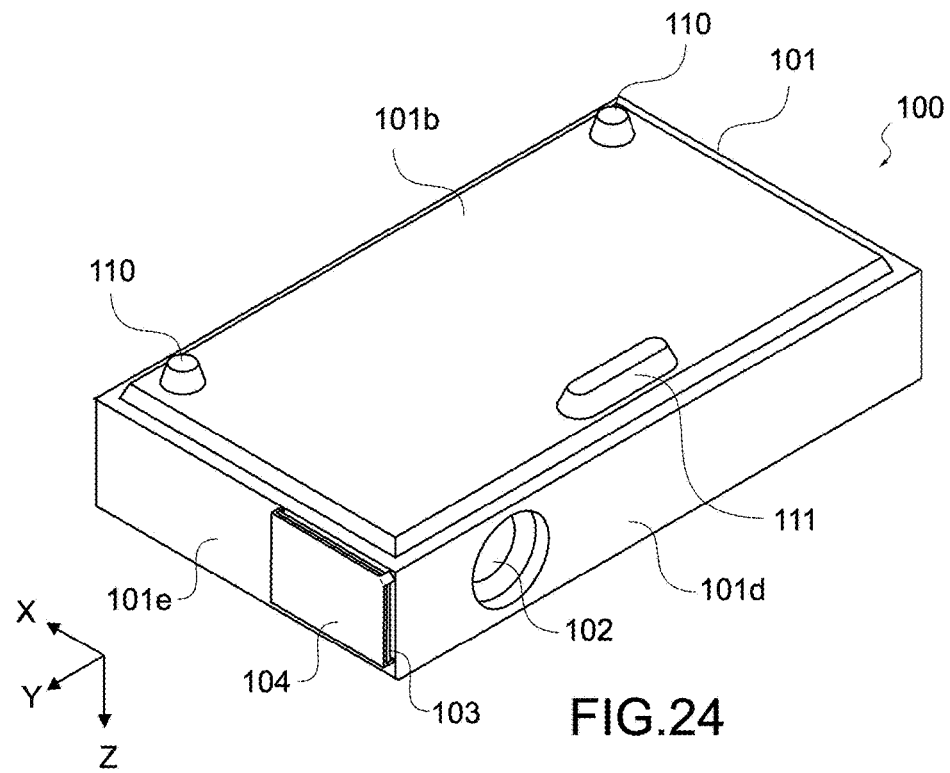
FIG. 24 A perspective view showing the projector-type display apparatus of another modification example of the present technology.
Figure 25:
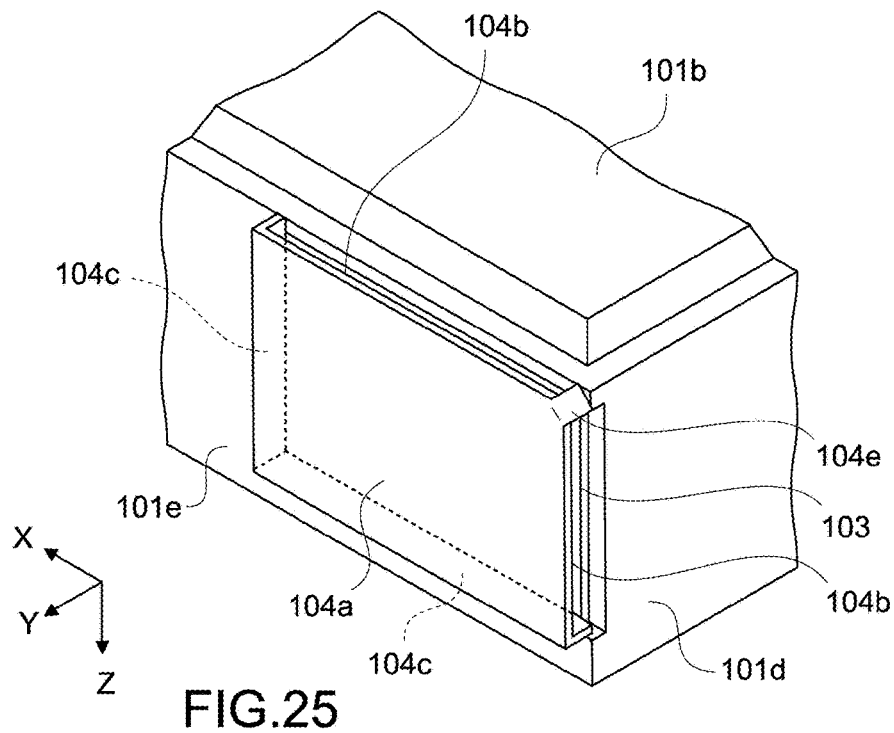
FIG. 25 A perspective view showing the air-filter and the filter-cover of the projector-type display apparatus.

FIG. 24 is a perspective view showing the projector-type display apparatus 100 of another modification example. FIG. 25 is a perspective view showing the air-filter 103 and the filter-cover 104 of the projector-type display apparatus of this modification example. As shown in FIG. 24 and FIG. 25, the air-filter 103 and the filter-cover 104 may be attached to the right-side surface 101*e*. The right-side surface 101*e* has the air-inlet-ports 101*h*, and the air-filter 103 covers the air-inlet-ports 101*h*.

The air-filter 103 and the filter-cover 104 are slid in a direction parallel to the right-side surface 101*e* to be attached to and detached from the housing 101. The open parts 104*b* are provided along rims of the right-side surface 101*e*. The side wall parts 104*c* are provided such that the side wall parts 104*c* separate the air-filter 103 from an area of the right-side surface 101*e*, the area avoiding facing the top plate part 104*a*.

The bottom surface 101*b* of the projector-type display apparatus 100 may be attached onto a wall, or the right-side surface 101*e* may be a vertical-upside. Since the right-side surface 101*e* has the air-filter 103 and the filter-cover 104, even if the right-side surface 101*e* is a vertical-upside, dust may be blocked from flowing into the air-filter 103 and, in addition, the air-filter 103 and the filter-cover 104 may be attached and detached with ease. Similarly, the right-side surface 101*e* or the top surface 101*a* may have the air-inlet-ports 101*h*, the air-filter 103, and the filter-cover 104.

Note that the present technology may employ the following structures.

(1) A projector-type display apparatus, including:
an optical-system-for-projecting;
a housing including an air-inlet-port, and housing the optical-system-for-projecting;
a fan housed in the housing, air from the air-inlet-port flowing into the fan;
an air-filter attachable to and detachable from the housing, and covering the air-inlet-port; and
a filter-cover attachable to and detachable from the air-filter.

(2) The projector-type display apparatus according to the aforementioned (1), in which the air-filter and the filter-cover are slid together to be attached to and detached from the housing.

(3) The projector-type display apparatus according to the aforementioned (1) or (2), in which the filter-cover includes a top plate part facing the air-filter, a side wall part that blocks air from flowing into a space between the top plate part and the air-filter, and an open part that allows air to flow into the space between the top plate part and the air-filter.

(4) The projector-type display apparatus according to the aforementioned (3), in which the open part is provided along a rim of a surface of the housing, the surface having the air-inlet-port, and
the side wall part is provided such that the side wall part separates the air-filter from an area of the surface, the area avoiding facing the top plate part.

(5) The projector-type display apparatus according to the aforementioned (3) or (4), in which
a part of the top plate part protrudes from the rim of the surface, and
the open part is provided between the rim of the surface and the top plate part protruding from the rim of the surface.

(6) The projector-type display apparatus according to any one of the aforementioned (1) to (5), in which
the filter-cover includes a dust catcher that blocks dust from falling onto the air-inlet-port when sliding.

(7) The projector-type display apparatus according to any one of the aforementioned (1) to (6), in which
the air-inlet-port is provided on a surface of the housing, the surface being a vertical-upside of the housing where the projector-type display apparatus is attached onto a ceiling.

The projector-type display apparatus according to any one of the aforementioned (1) to (6), in which
the air-inlet-port is provided on a surface of the housing, the surface being a vertical-upside of the housing where the projector-type display apparatus is attached onto a wall.

REFERENCE SIGNS LIST 100 projector-type display apparatus
101 housing
101*b* bottom surface
101*h* air-inlet-port
102 projector lens
103 air-filter
104 filter-cover
104*a* top plate part
104*b* open part
104*c* side wall part
104*f* dust catcher

The invention claimed is:

1. A projector-type display apparatus, comprising:
an optical-system-for-projecting;
a housing including an air-inlet-port, and housing the optical-system-for-projecting;
a fan housed in the housing, air from the air-inlet-port flowing into the fan;
an air-filter attachable to and detachable from the housing, and covering the air-inlet-port; and
a filter-cover attachable to and detachable from the air-filter, the filter-cover including a dust catcher that blocks dust from falling onto the air-inlet-port when sliding.

2. The projector-type display apparatus according to claim 1, wherein the air-filter and the filter-cover are slid together to be attached to and detached from the housing.

3. The projector-type display apparatus according to claim 2, wherein
the filter-cover includes a top plate part facing the air-filter, a side wall part that blocks air from flowing into a space between the top plate part and the air-filter, and an open part that allows air to flow into the space between the top plate part and the air-filter.

4. The projector-type display apparatus according to claim 3, wherein
the open part is provided along a rim of a surface of the housing, the surface having the air-inlet-port, and
the side wall part is provided such that the side wall part separates the air-filter from an area of the surface, the area avoiding facing the top plate part.

5. The projector-type display apparatus according to claim 2, wherein
the air-inlet-port is provided on a surface of the housing, the surface being a vertical-upside of the housing where the projector-type display apparatus is attached onto a ceiling.

6. The projector-type display apparatus according to claim 2, wherein
the air-inlet-port is provided on a surface of the housing, the surface being a vertical-upside of the housing where the projector-type display apparatus is attached onto a wall.

7. A projector-type display apparatus comprising:
an optical-system-for-projecting;
a housing including an air-inlet-port, and housing the optical-system-for-projecting;
a fan housed in the housing, air from the air-inlet-port flowing into the fan;
an air-filter attachable to and detachable from the housing, and covering the air-inlet-port; and
a filter-cover attachable to and detachable from the air-filter, wherein
an open part is provided along a rim of a surface of the housing, the surface having the air-inlet-port,
a side wall part is provided such that the side wall part separates the air-filter from an area of the surface, the area avoiding facing a top plate part,
a part of the top plate part protrudes from the rim of the surface, and
the open part is provided between the rim of the surface and the top plate part protruding from the rim of the surface.

8. The projector-type display apparatus according to claim 7, wherein
the filter-cover includes a dust catcher that blocks dust from falling onto the air-inlet-port when sliding.

* * * * *